United States Patent
Sarkar

(10) Patent No.: US 6,934,318 B2
(45) Date of Patent: Aug. 23, 2005

(54) METHOD AND SYSTEM FOR ENERGY BASED FRAME RATE DETERMINATION

(75) Inventor: Sandip Sarkar, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 750 days.

(21) Appl. No.: 09/748,056

(22) Filed: Dec. 22, 2000

(65) Prior Publication Data

US 2002/0110203 A1 Aug. 15, 2002

(51) Int. Cl.$^7$ ............................................. H04L 27/30
(52) U.S. Cl. ..................... 375/141; 375/324; 375/340; 714/774; 714/779; 714/800
(58) Field of Search .................. 375/140, 141, 375/262, 265, 324, 340, 341; 714/758, 760, 774, 786, 795, 800, 752, 770, 779

(56) References Cited

U.S. PATENT DOCUMENTS

| | | | |
|---|---|---|---|
| 4,901,307 A | | 2/1990 | Gilhousen et al. |
| 5,103,459 A | | 4/1992 | Gilhousen et al. |
| 5,509,020 A | * | 4/1996 | Iwakiri et al. ............... 714/704 |
| 5,796,757 A | * | 8/1998 | Czaja .......................... 714/789 |
| 6,480,556 B1 | * | 11/2002 | Guey .......................... 375/343 |
| 6,560,744 B1 | * | 5/2003 | Burshtein ................... 714/774 |
| 6,639,954 B2 | * | 10/2003 | Kuroiwa et al. ............. 375/341 |
| 6,687,233 B1 | * | 2/2004 | Chen et al. .................. 370/253 |

OTHER PUBLICATIONS

An Introduction to Communication Systems by Allan R. Hambley; p. 336.*
U.S. Appl. No. 08/963,386 filed Nov. 3, 1997, entitled "Method and Apparatus for High Rate Packet Data Transmission", Paul E. Bender, et al., QUALCOMM Incorporated, San Diego, California (USA).

* cited by examiner

*Primary Examiner*—Dac V. Ha
(74) *Attorney, Agent, or Firm*—Philip R. Wadsworth; Thien T. Nguyen

(57) ABSTRACT

A sequence of code symbols is supplied to a rate decision block. The sequence of code symbols can be output from a Viterbi decoder, and may correspond to block encoded and convolutional encoded output from a vocoder, produced in data frames at varying data rates, or frame rates, unknown to the decoder or to the rate decision block. The rate decision block determines a number of frame energies based on the sequence of code symbols, where each frame energy corresponds to a tentative frame rate. Each frame energy can be determined, by measuring the power and duration of each code symbol based on the tentative frame rate, to determine the tentative energy of each code symbol in a frame, and then adding the tentative energies of all the code symbols in the frame. The rate decision block determines a final frame rate when the frame energies meets a desired condition.

4 Claims, 4 Drawing Sheets

Example Vocoder Frame Formats

METHOD AND SYSTEM FOR ENERGY BASED FRAME RATE DETERMINATION

BACKGROUND OF THE INVENTION

1. Field of the Invention

The present invention generally relates to the field of wireless communication systems. More specifically, the invention relates to rate decision methods for code division multiple access protocols.

2. Related Art

In wireless communication systems several users share a common communication channel. To avoid conflicts arising from several users transmitting information over the communication channel at the same time, some regulation on allocating the available channel capacity to the users is required. Regulation of user access to the communication channel is achieved by various forms of multiple access protocols. One class of these protocols is the class of code division multiple access (CDMA) protocols. For example, variations of the CDMA protocols include direct sequence (DS-CDMA), time-hopped (TH-CDMA), frequency hopped (FH-CDMA), and hybrids of these. In addition to providing multiple access allocation to a channel of limited capacity, the protocol can serve other functions, for example, providing isolation of users from each other, i.e. limiting interference between users, and providing security by making interception and decoding difficult for a non-intended receiver, also referred to as low probability of intercept.

The multiple access function of CDMA protocols is primarily achieved by means of coding. Each user uniquely encodes its information signal into a transmission signal. The intended receiver, knowing the code sequences of the user, can decode the transmission signal to receive the information. The encoding of the information signal spreads its spectrum so that the bandwidth of the encoded transmission signal is much greater than the original bandwidth of the information signal. For this reason CDMA is also referred to as "spread spectrum" modulation or coding. The energy of each user's signal is spread across the channel bandwidth so that each user's signal appears as noise to the other users. So long as the decoding process can achieve an adequate signal to noise ratio, i.e. separation of the desired user's signal from the "noise" of the other users, the information in the signal can be recovered.

A number of methods have been implemented to provide effective coding and decoding of spread spectrum signals. The methods include error detection and correction codes, and convolutional codes. In wireless communications, especially in voice communications, it is desirable to provide communication between two users in both directions simultaneously, referred to as duplexing or full-duplexing. One method used to provide duplexing with CDMA is frequency division duplexing. In frequency division duplexing, one frequency band is used for communication from a base station to a mobile user, called the forward channel, and another frequency band is used for communication from the mobile user to the base station, called the reverse channel. Specific implementation of coding and modulation may differ between forward and reverse channels.

The user's information signal in the form of digital data is first coded to protect it from errors. The digital data, for example, may come from a voice encoder, which converts the sound of the user's voice into a sequence of binary digits or bits. The coding protects the digital data from errors by introducing redundancy into the information signal. Codes used to detect errors are called error detection codes, and codes which are capable of detecting and correcting errors are called error correction codes. Two basic types of error detection and correction codes are block codes and convolutional codes.

Block codes are forward error correction (FEC) codes that enable a certain amount of errors to be detected and corrected without retransmitting the user's information signal. In a block code the digital data from the user's information signal is coded into blocks of some length, say n bits. Of the n bits, k bits are encoded information and n–k bits are redundant bits used for error detection and correction when the blocks are decoded to retrieve the digital data of the user's information signal. The rate of the code is defined as $R=k/n$, and is equal to the input rate of user information being coded divided by the output rate of coded information being transmitted. There are many examples of block codes known in the art. A class of block codes referred to as cyclic redundancy checkers ("CRC") are commonly used in CDMA systems.

Convolutional codes operate by mapping a continuous information sequence of bits from the digital data of the user's information signal into a continuous encoded sequence of bits for transmission. By way of contrast, convolutional codes are different from block codes in that information sequences are not first grouped into distinct blocks and encoded. A convolutional code is generated by passing the information sequence through a shift register. The shift register contains, in general, N stages of with k bits in each stage and n function generators. The information sequence is shifted through the N stages k bits at a time, and for each k bits of the information sequence the n function generators produce n bits of the encoded sequence. Similar to block codes, the rate of the code is defined as $R=k/n$, and is equal to the input rate of user information being coded divided by the output rate of coded information being transmitted. The number N is called the constraint length of the code; complexity—or computing cost—of the code increases exponentially with the constraint length. A convolutional code of constraint length 9 and a ¾ code rate, for example, is used in some CDMA systems.

The highly structured nature of the mapping of the continuous information sequence of bits into continuous encoded sequence of bits enables the use of decoding algorithms for convolutional codes which are considerably different from those used for block codes. The coding performed by a particular convolutional code can be represented in various ways. For example, the coding may be represented by generator polynomials, logic tables, state diagrams, or trellis diagrams. If the coding is represented by a trellis diagram, for example, the particular trellis diagram representation will depend on the particular convolutional code being represented. The trellis diagram representation depends on the convolutional code in such a way that decoding of the encoded sequence can be performed if the trellis diagram representation is known.

Decoding of the encoded sequence, also referred to as "detection", requires the use of a method such as Viterbi decoding. Viterbi decoding is a method for decoding convolutional codes that uses the trellis diagram representation. In the trellis diagram, each path through the trellis corresponds to a possible encoded sequence from the convolutional coder and the original information sequence that generated the encoded sequence. The Viterbi algorithm uses the encoded sequence actually received to determine a value of a metric for some of the paths through the trellis and to eliminate other paths from consideration. Finally, the decoder chooses a path through the trellis with the most favorable value of the metric, and the corresponding information sequence is thereby decoded. Thus, the Viterbi decoder provides maximum likelihood detection, as known in the art.

To provide speech communications in a CDMA system, the user's speech is encoded into digital form. A speech coder is used to convert speech into the digital data of the user's information signal for transmission over the communication channel using spread spectrum coding. Due to the desire to accommodate many users within a limited allocated bandwidth, channel capacity is an economically scarce commodity in wireless communications. Thus, it is desirable to provide the highest possible speech quality over the CDMA system while using the least possible amount of channel capacity. For this reason, digital wireless communications systems generally perform some type of compression of the digital speech signal. "Vocoders" compress the information of a speech coder signal into a signal that can be sent at a lower data rate, which is typically in the range of 4000 to 15000 bits per second (bps). Vocoders typically achieve very high economy in transmission bit rate of the user's information signal.

The economy and transmission rate efficiency of vocoders is based on using a priori knowledge about certain characteristics of the speech signal, for example, pauses and gaps, and using those characteristics to advantage. There are several different types of vocoders known in the art, such as channel vocoders, formant vocoders, Cepstrum vocoders, and LPC (linear predictive coding) vocoders. LPC vocoders can be further distinguished as multi-pulse excited LPC (MPE-LPC), code-excited LPC (CELP), and residual excited LPC (RELP).

The CELP vocoder, for example, can be a variable rate vocoder. To provide greater economy and transmission rate efficiency the variable rate vocoder takes advantage of pauses and gaps in speech and reduces its output, for example, from 14400 bps to 1800 bps during silent periods. The vocoder generates its output in "frames." Each frame contains a certain number of data bits, and frames are produced at constant time intervals, for example, one frame every 20 milliseconds (msec). Thus, when the vocoder slows down, there are less data bits per frame. The vocoder produces frames only at a finite number of specifically chosen rates. Using the example rates already given, for example, a frame at the maximum rate of 14400 bps is referred to as a "full rate" rate frame; a frame at 1800 bps—one eighth the maximum rate—is referred to as an "eighth rate" frame, etc.

The data bits of each frame are encoded by the convolutional encoder into code symbols. Thus, the code symbol rate varies at the output of the convolutional encoder. For example, there are eight times as many code symbols encoded from a full rate frame as from an eighth rate frame. In order to keep a constant code symbol rate, some code symbols are repeated before any further processing. For example, the code symbols from a full rate frame are not repeated; the code symbols from an eighth rate frame are repeated 7 times. In the above example then, a coded sequence from an eighth rate frame could be indiscernible from a coded sequence from a full rate frame in which there are strings of eight identical symbols. Thus, when decoding the sequence of code symbols encoded by the convolutional encoder, using—for example—the Viterbi decoder discussed above, some mechanism must be provided to determine the frame rate of the code symbols.

Current methods of determining the frame rate of the code symbols during decoding for wireless speech communications fail frequently enough to produce noticeably audible and unacceptable degradation of sound quality at the receiver.

Thus, there is a need in the art for a reliable and low error rate, method of determining, without a priori knowledge, the frame rate of variable frame rate encoded speech data. Further, there is need in the art for a method and system, which is fast and efficient, of determining, without a priori knowledge, the frame rate of variable frame rate encoded speech data.

SUMMARY OF THE INVENTION

The present invention is directed to a method and system for energy based frame rate determination. The invention overcomes the need in the art for a reliable and low error rate, method and system of determining, without a priori knowledge, the frame rate of variable frame rate encoded data. Also the invention provides a fast and efficient means of determining, without a priori knowledge, the frame rate of variable frame rate encoded speech data.

In one aspect of the invention a sequence of code symbols is supplied to a rate decision block. For example, the sequence of code symbols can be output from a Viterbi decoder, and may correspond to block encoded and convolutional encoded output from a vocoder, produced in data frames at varying data rates, or frame rates, unknown to the decoder or to the rate decision block. The rate decision block may be part of a receiver in a CDMA wireless communications system.

The rate decision block determines a number of frame energies based on the sequence of code symbols, where each frame energy corresponds to a tentative frame rate. Each frame energy can be determined, for example, by measuring the power and duration of each code symbol based on the tentative frame rate, to determine the tentative energy of each code symbol in a frame, and by thereafter adding the tentative energies of all the code symbols in the frame.

The rate decision block determines a final frame rate when the frame energies meets a desired condition. The desired condition can be determined based on whether various combinations of frame energies, obtained by multiplying the tentative frame energies by respective parameters and adding the respective results, exceed predetermined threshold energies.

DETAILED DESCRIPTION OF THE PREFERRED EMBODIMENTS

The presently disclosed embodiments are directed to method and system for energy based frame rate determination. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1A:
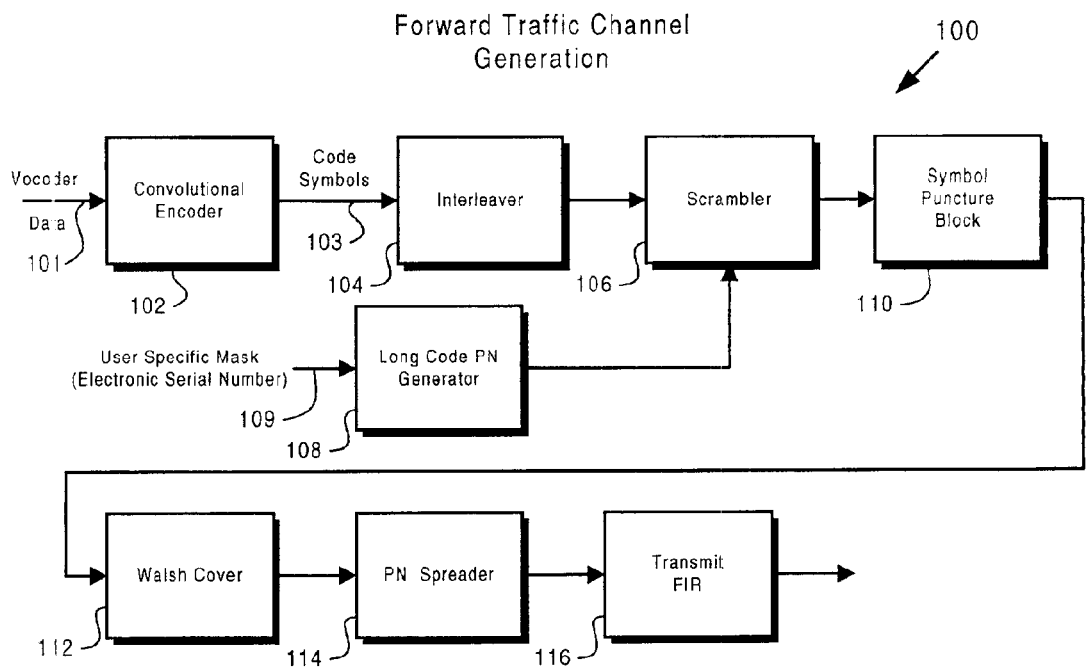
FIG. 1A illustrates, in block diagram form, an example of information coding and transmission in a CDMA system.

FIG. 1A illustrates an example of how variable frame rate vocoder data is transmitted in a CDMA or spread spectrum communications system. Exemplary system 100 shown in FIG. 1A constitutes part of a transmitter which may generally reside in a base station, gateway or a satellite repeater for generation of the "forward traffic channel." In the example shown in FIG. 1A, input vocoder data 101 contains the user's information signal or message of interest to be transmitted across a communication channel to a receiver (the communication channel is not shown in any of the Figures). Vocoder data 101, which are typically already block encoded, are first input to convolutional encoder 102. The redundancy introduced by convolutional encoder 102 enables the receiver to correct some detection errors without the need to increase transmission power. Vocoder data 101 is formatted at varying rates, as further discussed below in relation to FIG. 2. Convolutional encoder 102 outputs code symbol sequence 103, generally referred to as "code symbols." Convolutional encoder 102 compensates for the varying rates of input vocoder data 101 by providing repetition of code symbols in code symbol sequence 103 for the slower vocoder input data rates.

Interleaver 104 receives code symbol sequence 103 from convolutional encoder 102 and interleaves the code symbols prior to processing by scrambler 106. Interleaving protects the sequence of bits comprising the digital data of the user's information signal from noise bursts or "deep fades" by spreading successive bits of the information sequence apart in time, also referred to as providing "time diversity" to the sequence of bits. Interleaving is used in a transmission system, such as system 100 in FIG. 1A, in order to cause noise bursts or deep fades to appear random (i.e. independent) rather than correlated at the receiver. Interleaving is also used to ensure that, in the presence of noise bursts or deep fades, successive symbols in a block of source data are not corrupted at the same time. Since error control codes are generally designed to protect against channel errors that may occur independently, by scrambling the time order of source data bits, interleavers ensure that error control coding remains effective in detection and correction of errors. In exemplary system 100 in FIG. 1A, interleaver 104 may be a block interleaver or a convolutional interleaver, which are both known in the art.

The interleaved code symbols are passed on to scrambler 106. Scrambler 106 multiplies the interleaved code symbols by a pseudo-random sequence, also called a PN (pseudo-noise) sequence. A PN sequence is a binary sequence that is deterministic but resembles a random binary sequence. As such, a PN sequence has nearly an equal number of 0's and 1's, a very low correlation between shifted versions of the sequence, and a very low cross-correlation between any two sequences. These properties make PN sequences very desirable in wireless digital communications. A PN sequence is generated by long code PN generator 108 and passed on to scrambler 106. The PN sequence is usually generated using sequential logic. Feedback shift registers consisting of consecutive stages of state memory elements are typically utilized. Binary sequences are shifted through the shift registers in response to clock pulses, and the outputs of the various stages are logically combined and fed back as the input to the first stage. The output of the last stage is the desired PN sequence. In order to provide a unique PN sequence for each user, long code PN generator 108 is "masked," i.e. the PN sequence is multiplied by a sequence of bits or mask. User specific mask 109 is a sequence of bits which depends on the subscriber unit's electronic serial number ("ESN") and is fed into long code PN generator 108. Thus, scrambler 106 provides a unique scrambling for each user's data.

In exemplary system 100, the scrambled symbols from scrambler 106 are passed on to symbol puncture block 110. Symbol puncturing is a method for quickly placing a desired symbol directly into the message symbol stream by simply overwriting a message symbol. For example, symbol puncturing is typically used in CDMA systems to insert power control information, which can be in the form of a single symbol or power control bit, quickly into the message stream to provide fast response for the power control subsystem. Although symbol puncturing has a potential for introducing errors in the message or source data received at the receiver, recent techniques minimize or eliminate such errors. In exemplary system 100, symbol puncture block 110 is used for inserting various control symbols, such as power control symbols and symbols providing reference for time, phase, and signal strength, into the message symbol stream. The control symbols punctured into the message symbol stream are typically time division multiplexed into the message symbol stream.

As shown in FIG. 1A, the symbol stream output by symbol puncture block 110 is input to Walsh cover 112. In CDMA communications, the user's information signal is spread to allow many users, i.e. subscriber units, to simultaneously use the same bandwidth without significantly interfering with one another. One means of spreading is the application of distinct "orthogonal" spreading functions, such as Walsh functions, to each user's information signal. "Orthogonality" refers to lack of correlation between the spreading functions. In a given spread spectrum communication system using Walsh functions (also called Walsh code sequences), a pre-defined Walsh function matrix having n rows of n chips each is established in advance to define the different Walsh functions to be used to distinguish different user information signals. As an example, for a given sector (in CDMA, each sector is a subset of a cell), each forward channel is assigned a distinct Walsh function. In other words, communications between a base station and each subscriber unit are coded by a distinct Walsh code sequence. Referring to FIG. 1A, each symbol input to Walsh cover 112 is coded according to the Walsh function assigned to a particular traffic channel in order to separate each subscriber unit (e.g. a particular cell phone user) from the others.

A Walsh function having n rows of n chips each is also referred to as a Walsh function matrix of order n. An example of a Walsh function matrix where n is equal to 4, i.e. a Walsh function matrix of order 4, is shown below:

$$\begin{pmatrix} 1 & 1 & 1 & 1 \\ 1 & 0 & 1 & 0 \\ 1 & 1 & 0 & 0 \\ 1 & 0 & 0 & 1 \end{pmatrix}$$

In the above example, there are 4 Walsh functions, each function having 4 chips. Each Walsh function is one row in the above Walsh function matrix. For example, the second row of the Walsh function matrix is the Walsh function having the sequence 1, 0, 1, 0. It is seen that each Walsh function, i.e. each row in the above matrix, has zero correlation with any other row in the matrix. Stated differently, exactly half of the chips in every Walsh function differ from those in every other Walsh function in the matrix.

Application of distinct orthogonal spreading functions to each user's information signal results in a transformation of each symbol of digital data in the user's information signal into a respective sequence of output chips, where each sequence of output chips is orthogonal with every other sequence of output chips. Using Walsh functions, the transformation can be performed by XOR'ing each symbol of digital data in the user's information signal with a sequence of chips in a particular Walsh function. XOR'ing the second Walsh function in the above example, i.e. the second row of the matrix, with a user's data symbol "a" results in the sequence of output chips: $\bar{a}$, a, $\bar{a}$, a, where "$\bar{a}$" denotes the binary complement of a. Thus in this illustrative example, each data symbol is spread into a sequence of output chips having a length of 4.

The operation of a Walsh function to convert each symbol into a sequence of chips is also referred to as Walsh "covering." In practice, Walsh functions of length 16, 32, 64, or 128 (i.e. Walsh functions having respectively 16, 32, 64, or 128 chips in each Walsh code sequence) are used. As an example, when a Walsh function of length 64 is used, orthogonality of 64 users within a given sector of a cell is achieved. For each symbol input to it, therefore, Walsh cover 112 outputs a sequence of chips having, for example, a length of 64.

As shown in FIG. 1A, the output of Walsh cover 112 is provided to PN spreader 114. The PN spreading performed by PN spreader 114 is used to allow many users to simultaneously use the same bandwidth without significantly interfering with one another. PN spreading is similar to the application, discussed above, of distinct orthogonal spreading functions to each user's information signal, but PN sequences are used instead of orthogonal functions. The PN sequences used for spreading are also called "short" PN code sequences to distinguish them from the long code PN sequence assigned to each user based on ESN, as discussed above.

The output chip sequence of a PN spreader is also referred to as a spread spectrum signal since it has a bandwidth much greater than the minimum required signal bandwidth. Spread spectrum signals are demodulated at the receiver through cross-correlation with a locally generated version of the PN sequence. Cross-correlation with the corrector PN sequence "despreads" the spread spectrum signal and restores the modulated message, whereas cross-correlating a signal by an unintended user results in a very small amount of wideband noise at the receiver output. The general principles of CDMA communication systems, and in particular the general principles for generation of spread spectrum signals for transmission over a communication channel is described in U.S. Pat. No. 4,901,307 entitled "Spread Spectrum Multiple Access Communication System Using Satellite or Terrestrial Repeaters" and assigned to the assignee of the present invention. The disclosure in that patent, i.e. U.S. Pat. No. 4,901,307, is hereby fully incorporated by reference into the present application. U.S. Pat. No. 5,103,459 entitled "System and Method for Generating Signal Waveforms in a CDMA Cellular Telephone System" and assigned to the assignee of the present invention, disclosed principles related to PN spreading, Walsh covering, and techniques to generated CDMA spread spectrum communication signal. The disclosure in that patent, i.e. U.S. Pat. No. 5,103,459, is also hereby fully incorporated by reference into the present application. Further, the present invention utilizes time multiplexing of data and various principles related to "high data rate" communication systems, and the present invention can be used in a "high data rate" communication systems, disclosed in U.S. patent application entitled "Method and Apparatus for High Rate Packet Data Transmission" Ser. No. 08/963,386 filed on Nov. 3, 1997, and assigned to the assignee of the present invention. The disclosure in that patent application is also hereby fully incorporated by reference into the present application.

Figure 1B:
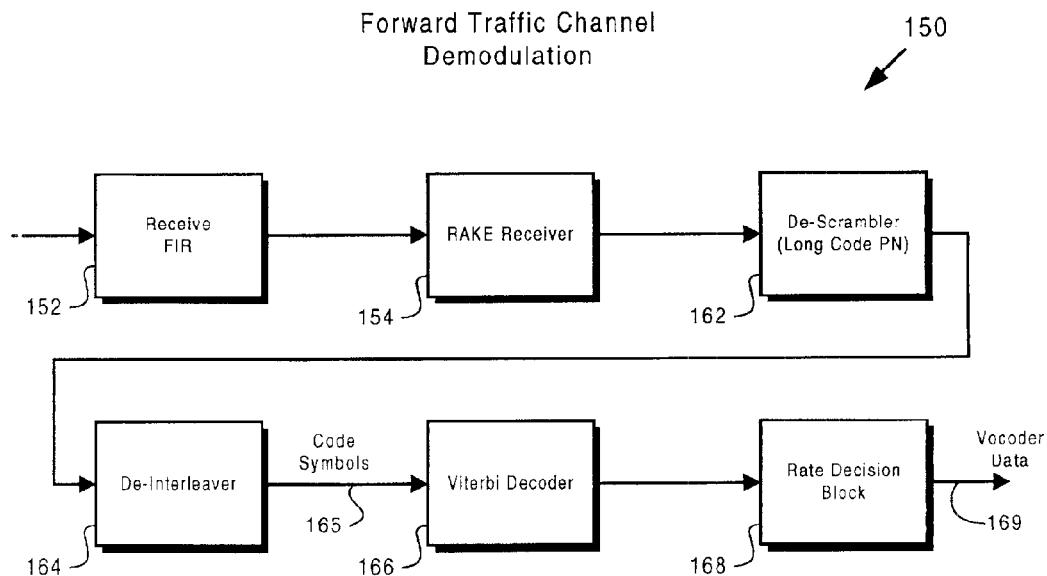
FIG. 1B illustrates, in block diagram form, an example of information reception and decoding in a CDMA system.

The output chip sequence of PN spreader 114 is passed on to "transmit FIR" 116. Transmit FIR 116 is typically an FIR filter used for pulse shaping signals prior to their transmission over a communication channel. The output signal of transmit FIR 116 is sent across the communication channel to a receiver, which is shown in FIG. 1B. The communication channel usually refers to the physical medium which is used to send the signals from the transmitter to the receiver. The communication channel in the present application may comprise free space, wire lines, optical fiber cables, or a microwave radio channel.

FIG. 1B illustrates an example of how variable frame rate vocoder data is received in a CDMA or spread spectrum communications system in accordance with one embodiment. Exemplary system 150 shown in FIG. 1B constitutes part of a receiver which may generally reside in a subscriber unit when communication is taking place in a forward channel. In the example shown in FIG. 1B, receive FIR 152 receives, through the communication channel, the signals output by transmit FIR 116 containing the information or message of interest. Receive FIR 152 is used to perform, among other things, pulse shaping on signals received from the communication channel.

Output from receive FIR 152 is provided to RAKE receiver 154. RAKE receiver 154 is used to counteract the effects of "multipath" in the communication channel as known in the art. RAKE receiver 154 "de-spreads" both the short PN code sequence spreading and the Walsh code sequence spreading. Thus, output of RAKE receiver 154 is a scrambled code symbol sequence corresponding to the output of scrambler 106.

RAKE receiver 154 provides scrambled code symbols to de-scrambler 162, which de-scrambles the sequence of symbols by reversing the operations used to scramble them. De-scrambler 162 uses the same user specific mask 109 and long code PN sequence used by scrambler 106, in order to de-scramble the code symbols. The de-scrambled code symbol sequence is passed on to de-interleaver 164, which performs the inverse operation performed by interleaver 104. The structure and function of de-scrambler 162 and de-interleaver 164 are well known in the art. The combined effect of these modules, i.e. de-scrambler 162 and de-interleaver 164, is to reverse the combined effect of interleaver 104 and scrambler 106 in system 100. The output of de-interleaver 164, i.e. code symbol sequence 165, should ideally be the same as code symbol sequence 103 output by convolutional encoder 102.

Code symbol sequence 165 is input to Viterbi decoder 166. Due to imperfections in the communication channel, code symbol sequence 165 may not be the same as code symbol sequence 103. As discussed above, Viterbi decoder 166 provides maximum likelihood detection of code symbol sequences. Simply stated, maximum likelihood detection determines a valid code symbol sequence, such as code symbol sequence 103, which is most likely to have produced code symbol sequence 165 that is received by Viterbi decoder 166. Thus, given code symbol sequence 165, Viterbi decoder 166 determines a "best estimate" of code symbol sequence 103. As noted above, code symbol sequence 103 may contain repeated symbols that compensate for variable vocoder frame rates. Different frame rates are chosen by the vocoder in response to varying voice patterns, essentially at random, so that the Viterbi decoder has no way of determining, a priori, what frame rates have been used or which code symbols have been repeated. Therefore, the Viterbi decoder decodes code symbol sequence 165 according to each possible frame rate output of the vocoder. For example, if four different frame rates are used by the vocoder, the Viterbi decoder outputs four different decoded symbol sequences, one for each different frame rate, in response to received code symbol sequence 165.

All of the different decoded symbol sequences output by the Viterbi decoder are input to rate decision block 168. For example, if four different frame rates are used by the vocoder, four different decoded symbol sequences, one for each different frame rate, are input to rate decision block 168. One of the different decoded symbol sequences, the one that has been decoded using the same frame rate at which it was encoded, is correct. A correctly decoded symbol sequence output by rate decision block 168 is in the same form as vocoder data 101. A correctly decoded symbol sequence contains the user's information signal, in the form of vocoder data 101, which can be decoded by a vocoder to reconstruct the original speech signal. Incorrectly decoded symbol sequences input to the vocoder result in degraded reconstruction of the original speech signal and noticeable deterioration in sound quality. Rate decision block 168 determines which rate, and therefore which of the decoded symbol sequences output by the Viterbi decoder, is most likely to be correct and outputs that sequence, vocoder data sequence 169, to the vocoder.

Rate decision block 168 can utilize metrics, i.e. a measurement of some aspect or quality of the decoded symbol sequences output by the Viterbi decoder, for example, or a measurement of the decoding process. Metrics are further discussed below. Rate decision block 168 can also utilize algorithms to determine the value of some metrics, for example, the frame rate energy metric algorithm, described below, used to determine the frame rate energy metric, also described below. Further, rate decision block 168 can utilize algorithms which use a combination of metrics and decision rules to determine which rate, and therefore which of the decoded symbol sequences output by the Viterbi decoder, is most likely to be correct. Thus, using a combination of metrics and algorithms rate decision block 168 outputs vocoder data sequence 169.

Figure 2A:
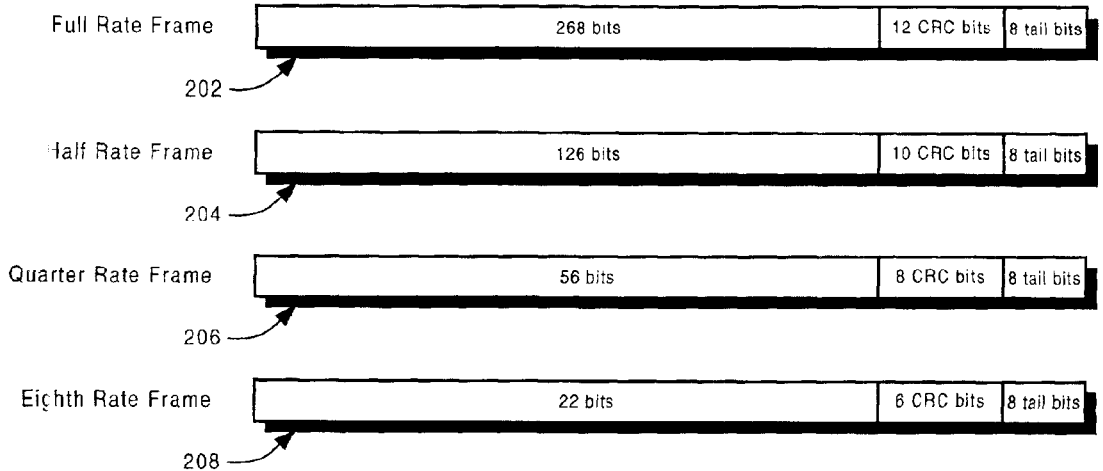
FIG. 2A illustrates one example of frame formats after output from a vocoder.

As discussed above, a speech coder can take advantage of pauses and gaps in speech to decrease the data rate at its output, thereby providing greater transmission rate efficiency and economy in use of channel capacity. This reduction of data rate is accomplished by varying the output rate of the speech coder. As also stated above, the output of the speech coder (not shown in any of the Figures) is provided to a vocoder for compression. FIG. 2A shows example variable rate vocoder output formats. Typically, the output of a variable rate vocoder is produced in "frames" consisting of a number of bits of information. The frames are generated at constant time intervals or, equivalently, at a constant rate. For example, an interval of 20 msec (milliseconds) for each frame can be used, or equivalently, 50 frames per second. Thus, the output rate of the vocoder is varied by varying the number of bits in each frame. Only a certain number of specific output rates are used, the group of rates being referred to as the "rate set" of the vocoder. FIG. 2A shows frame formats for an example rate set consisting of "full" rate frame 202, "half" rate frame 204, "quarter" rate frame 206, and "eighth" rate frame 208.

As seen in FIG. 2A, full rate frame 202, corresponding to the full rate, i.e. maximum output rate of the vocoder, contains a total of 288 bits. Thus, using the 20 msec frame interval for example, the full rate for the vocoder of this example is 14400 bps (bits per second). The half rate is 7200 bps; quarter rate is 3600 bps; and eighth rate is 1800 bps. Thus, a first example rate set comprises rates of 14400 bps, 7200 bps, 3600 bps, and 1800 bps. Other rate sets can be used. A second example rate set comprises rates of 9600 bps, 4800 bps, 2400 bps, and 1200 bps. The frames of this rate set would also be referred to as full rate frame, half rate frame, etc. In addition, the output rate of the speech coder may also be referred to as the "frame rate." It is noted that the frame itself contains no specific information as to what the frame rate is, and that the frame rate varies in response to the speech being coded. Thus, frame rate varies unpredictably.

FIG. 2A also shows that each frame contains a certain number of CRC bits, thus the frames have been coded using a block code. In this example, the block code is CRC, which is a forward error correction code, as discussed above. As seen in FIG. 2A the number of CRC bits can vary according to the number of bits in the frame. In general, a frame with less data bits requires less CRC bits to provide adequate error correction. For some rate sets, CRC bits may not even be used for the lowest data rate frames.

Continuing with the example rate set of FIG. 2A, the frames are encoded by a convolutional encoder such as convolutional encoder 102 shown in FIG. 1A. Convolutional codes have been discussed in general above. Convolutional codes of different rates and constraint lengths can be used, but the same code is used for all frames of the rate set. For example, for the first example rate set, with rates of 14400, 7200, 3600, and 1800 bps, a ¾ code rate, constraint length 9 convolutional code can be used. For the second example rate set, with rates of 9600, 4800, 2400, and 1200 bps, a ½ code rate, constraint length 9 convolutional code can be used.

Recalling the definition of code rate for a convolutional code, the rate of the code is equal to the input rate of information being coded divided by the output rate of coded information. Thus for a ¾ code rate, there are 4 symbols output for every 3 bits input. For example, returning to the first example rate set and inputting a full rate frame to the convolutional coder, the input rate of 14400 bps, and a ¾ code rate implies an output rate of 19200 code symbols per second (14400/19200=¾) for a full rate frame. Thus for the first example rate set, output code symbol rates of 19200, 9600, 4800, and 2400 code symbols per second are produced. Using a ½ code rate with the second example rate set, instead of a ¾ code rate, output code symbol rates of 19200, 9600, 4800, and 2400 code symbols per second also can be produced. The preceding rates typically apply to the forward channel. For the reverse channel, rate sets and convolutional encoder rates can be chosen to produce a maximum output code symbol rate of 28800 code symbols per second, and so forth.

Figure 2B:
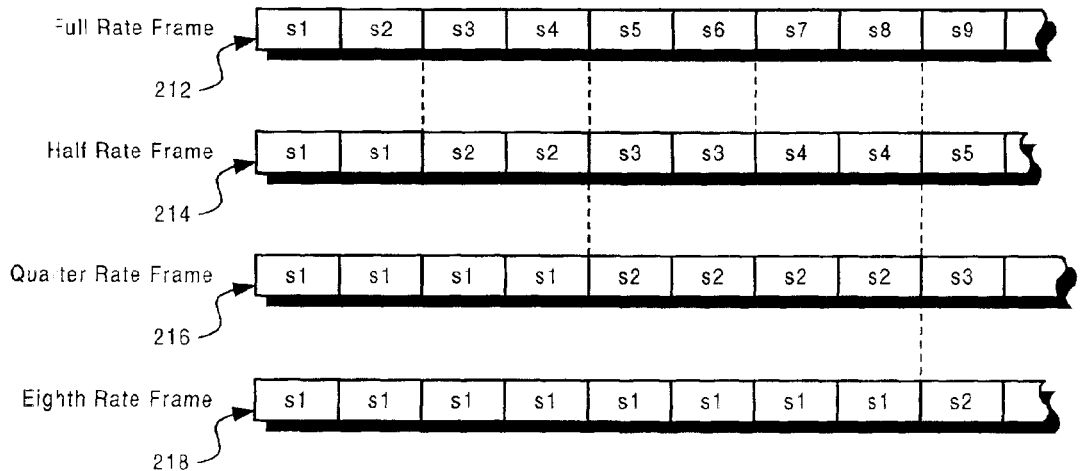
FIG. 2B illustrates one example of comparison of coded symbol sequences after symbol repetition in a CDMA system.

FIG. 2B illustrates an example of code symbol repetition. In order to keep a constant code symbol rate, output code symbols from the convolutional encoder may be repeated before being interleaved by an interleaver such as interleaver 104 in FIG. 1A. FIG. 2B shows a comparison of possible code symbol sequences output from the convolutional encoder after repetition. Code symbols from a full rate frame are not repeated, as shown by code symbol sequence 212 of FIG. 2B. In order to prevent gaps or holes in the signal transmission, i.e. to keep the transmission rate constant, however, each code symbol from a half rate frame is repeated once, as shown by code symbol sequence 214 of FIG. 2B. Similarly, each code symbol from a quarter rate frame is repeated 3 times, as shown by code symbol sequence 216, and each code symbol from an eighth rate frame is repeated 7 times, as shown by code symbol sequence 218.

For example, returning to the forward channel example using the first or second example rate set, for the full rate frame, 19200 code symbols per second are output from the convolutional coder, and the code symbols are not repeated. For the half rate frame, 9600 code symbols per second are output; each code symbol is repeated one time. For the quarter rate frame, 4800 code symbols per second are output; each code symbol is repeated 3 times. For the eighth rate frame, 2400 code symbols per second are output; each code symbol is repeated 7 times. Repetition results in a constant output code symbol rate of 19200 code symbols per second for all possible frame rates.

After reception, including the process of de-interleaving as discussed above in connection with FIG. 1B, a received sequence of code symbols is produced which may resemble any of code symbol sequences 212, 214, 216 or 218. The received code symbol sequence is input to a decoder. The decoder can be a Viterbi decoder as discussed above in connection with FIG. 1. As discussed above the Viterbi algorithm uses the received code symbol sequence to determine values of a metric and chooses a corresponding decoded information sequence with the most favorable value of the metric, i.e. the information sequence that is most likely to have been originally encoded.

Correct operation of the Viterbi algorithm depends on what is considered to be an input symbol. For example, taking code symbol sequence 214 shown in FIG. 2B, corresponding to a half rate frame, the Viterbi algorithm can operate on either of two assumptions. The first assumption is that the input sequence is: s1, s1, s2, s2, . . . Note that this assumption is consistent with the erroneous notion that the symbols have been sent in a full rate frame and it just happens that s1 has been sent twice, s2 has been sent twice, etc. The second assumption is that the input sequence is: s1, s2, s3, s4 , . . . Note that this assumption is consistent with the correct notion that s1 has been sent once, s2 has been sent once, etc., that the symbols have been sent in a half rate frame, and that each symbol consists of a greater number of chips because code symbol repetition has the effect of spreading each symbol more (just as Walsh covering or PN spreading spreads each symbol into many chips). Thus, the correct assumption for this example is the second assumption.

The decoded information sequence produced by the Viterbi decoder will differ depending upon which input sequence is assumed. Continuing with the above example, the correct input sequence is the second one and a decoding based on that sequence is correct whereas a decoding based on the first sequence is in error. If the data had actually been sent in a full rate frame, however, the reverse would be true. Correct decoding, therefore, depends on a correct frame rate assumption, also referred to as "frame rate hypothesis". In practice, the received code symbol sequence is first decoded under all frame rate hypotheses, i.e. for each possible frame rate. Each possible frame rate from the set of frame rate hypotheses, i.e. from the rate set being used, is referred to as a "tentative frame rate." Then a metric or combination of metrics is applied afterward to determine the correct, or final, frame rate from the set of frame rate hypotheses. The correct information sequence is thereby decoded.

One example of a metric used to determine the correct frame rate is the application of the CRC error detection and correction code. For example, assuming a rate set as in FIG. 2A, decoding produces four decoded information sequences resembling the frames illustrated in FIG. 2A. The CRC bits of each frame are "parity" bits, which can be checked against the coded data of the frame to determine whether there is a "match", or not. If there is a "mismatch," the data and parity bits of the frame do not correspond to any valid CRC coding of data, and it can be assumed that errors have occurred in transmission of the data or that the frame rate is incorrect. In that the case the frame rate is given a CRC value of "0" or "incorrect." If there is a match, the data and parity bits of the frame correspond to some valid CRC coding of data, and there is a high probability that no errors have occurred in transmission of the data and that the frame rate is correct. In that case, the frame rate is given a CRC value of "1" or "correct", however, there is still some probability that an error has occurred. The probability that an error has occurred is dependent on the number of CRC bits in the frame. For example, suppose an incorrect frame is received, i.e. the data in the frame is "garbage." For an eighth rate frame with 6 CRC bits, the probability that the CRC check will erroneously indicate a correct frame is approximately 1 in $2^6$ or 1 in 64. When CRC checking is applied to the four frames in this example, frames with a match are chosen as candidates for the correct frame rate determination and are given a CRC value of "1." The probability of error using CRC values just discussed is too high, however, to ensure adequate vocoder sound quality. For frames with no CRC bits, this method is not even available. Therefore, it is necessary to use other metrics instead of or in addition to CRC.

Another example of a frame rate determination metric is "re-encoded symbol error rate" (RSER). For example, suppose that coded symbol sequence 214 shown in FIG. 2B is input to a Viterbi decoder assuming a half rate frame. The Viterbi decoder has decoded an information sequence based on the half rate frame hypothesis. That information sequence is then re-encoded and compared to original code symbol sequence 214. If the frame rate hypothesis was correct, the re-encoded code symbol sequence should match original code symbol sequence 214 or at least have a minimal number of mismatches, i.e. errors. The number of mismatches (or errors) for a coded symbol sequence of a given length is the re-encoded symbol error rate or RSER. When RSER is applied to the four frame rates in this example—by decoding an information sequence based on each of the four frame rate hypotheses, re-encoding each of the four information sequences, and obtaining a re-encoded symbol error rate for each frame rate hypothesis—frame rates with RSER below a certain value are chosen as candidates for the correct frame rate determination.

Another example of a frame rate determination metric is the Yamamoto quality metric. The Yamamoto quality metric considers the path metrics of the Viterbi decoder discussed above. If the path metrics are far apart in value, there is greater confidence in the decoded result than if the path metrics are close together. Thus, the Yamamoto quality metric indicates a correct frame rate if the two most favorable values of the path metrics are farther apart than some specific threshold value, and the Yamamoto quality metric indicates an incorrect frame rate if the two most favorable values of the path metrics are closer together than the specific threshold value.

To illustrate the Yamamoto metric by example, the Viterbi algorithm, as discussed above, uses the received code symbol sequence to determine values of a metric corresponding to different information sequences which may have been transmitted. The Viterbi algorithm decodes the code symbol sequence by choosing the information sequence that corresponds to the most favorable value of the metric. Suppose for example, that for the particular metric being used, the most "favorable" value means the least value. Suppose also that the Viterbi decoder has been given code symbol sequence 214 shown in FIG. 2B, assuming a half rate frame. The Viterbi decoder arrives at a number of metric values including, for example, 10.0 and 12.0, and suppose that 10.0 and 12.0 are the two lowest values of the metrics computed for code symbol sequence 214. Then the decoder chooses the information sequence corresponding to metric value 10.0 over the information sequences corresponding to any of the other metric values and in particular over the information sequences corresponding to metric value 12.0. The decoded sequence that the Viterbi decoder outputs is the chosen information sequence. The Yamamoto quality metric considers, in this example, the two lowest values of the metric and compares them to a threshold quantity. Suppose, for example, that the threshold quantity is equal to 1.5. Then, in this example, the difference between the two lowest metrics is greater than the threshold, so the Yamamoto quality metric indicates a correct frame rate hypothesis, and the frame rate is given a Yamamoto quality value of "1" or "correct." If the two lowest metric values from the Viterbi decoder had been, for example, 10.0 and 11.0, which are closer together than the threshold quantity of 1.5, then the Yamamoto quality metric would have indicated an incorrect frame rate hypothesis, and the frame rate would have been given a Yamamoto quality value of "0" or "incorrect." When the Yamamoto metric is applied to the four frame rates in this example—by comparing the lowest metrics of the Viterbi decoding based on each of the four frame rate hypotheses to a threshold quantity-frame rates with a Yamamoto quality value of "1" are chosen as candidates for the correct frame rate determination.

When one or a combination of the above described metrics, i.e. the CRC metric, RSER metric, and Yamamoto metric, are used, the probability of error in determination of the frame rate is still too high. Therefore, it is necessary to use other additional metrics to determine the frame rate with greater accuracy. According to one embodiment, the "symbol energy" is used as another metric to determine the correct frame rate. Simply stated, symbol energy is measured as the power required to transmit a symbol multiplied by the duration of the symbol. Redundant symbols reduce the energy per symbol required to transmit the same bit of information. Thus, when symbols are repeated, i.e. there are more redundant symbols, the symbol energy is reduced.

So referring to FIG. 2B, for example, the symbol energies of full rate frame sequence 212 are higher than the symbol energies of half rate frame sequence 214, which are higher than the symbol energies of quarter rate frame sequence 216, and so forth. Thus, an energy metric can be constructed which varies according to the frame rate by, for example, simply accumulating or adding up the symbol energies of a symbol sequence, based on each frame rate hypothesis. Thus, using code symbol sequence 214 for example, a full rate frame energy, $E_F$, can be determined based on the assumption that code symbol sequence 214 symbols have been sent in a full rate frame and just happen to be repeated; a half rate frame energy, $E_H$, can be determined based on the assumption that code symbol sequence 214 symbols have been sent in a half rate frame and that each symbol is "longer," i.e. that each symbol consists of a greater number of bits, rather than having been repeated; and so forth for a quarter rate frame energy, $E_Q$, and an eighth rate frame energy, $E_E$.

In practice, the symbol energies are affected by "fading" caused by various phenomena such as "multipath," "shadowing," and other types of interference, as known in the art. A pilot channel signal, which carries no information but merely provides reference for time, phase, and signal strength, is available simultaneously with the information channel signal. A pilot channel energy, $E_P$, can be determined for the pilot channel signal. The pilot channel signal can be assumed to be subject to the same fading as the information channel signal, and thus the pilot channel energy, $E_P$, is affected in the same way as the frame energies $E_F$, $E_H$, $E_Q$, and $E_E$. Therefore, the frame energies are in proportion to the pilot channel energy, $E_P$, so that dividing each frame energy by the pilot channel energy cancels the effects of channel fading. In other words, the ratios of frame energy to pilot channel energy remain constant even though the energies themselves do not remain constant. The energy ratios $E_F/E_P$, $E_H/E_P$, $E_Q/E_P$, and $E_E/E_P$ are referred to as "normalized" frame energies. In order to use the normalized frame energies in a metric which can be used to determine frame rate, a threshold energy is determined for each pair of normalized frame energies.

Figure 3:
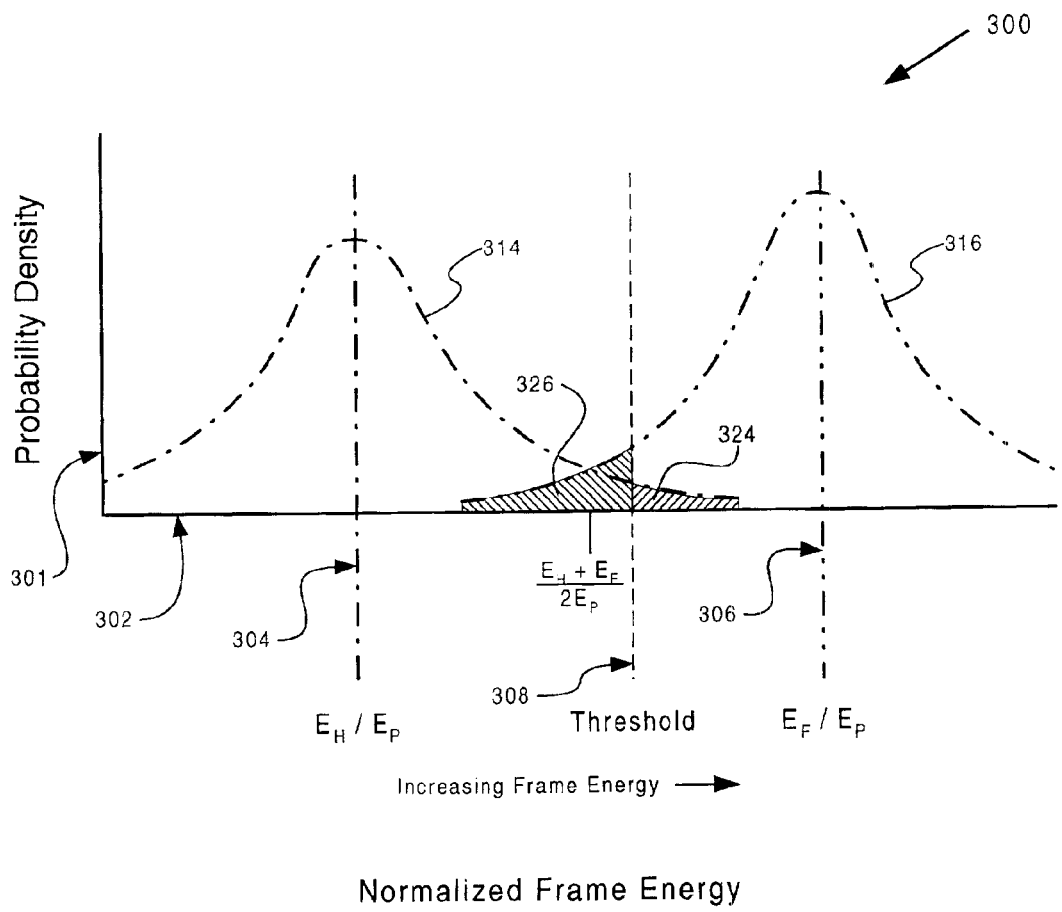
FIG. 3 illustrates an example of probability density functions for normalized frame energies in a CDMA system.

FIG. 3 illustrates an example of threshold energy determination based on probability density functions for half rate normalized frame energy $E_H/E_P$ and full rate normalized frame energy $E_F/E_P$. FIG. 3 shows graph 300 having probability density axis 301. Graph 300 shows probability density axis 301 plotted against normalized frame energy axis 302. The normalized frame energies for half rate and full rate frames are distributed according to probability density curve 314 for half rate frames and probability density curve 316 for full rate frames.

The average value of half rate normalized frame energies is indicated by dashed line 304, which is also labeled "$E_H/E_P$." The average value of full rate normalized frame energies is indicated by dashed line 306 which is also labeled "$E_F/E_P$." A threshold energy value is indicated by dashed line 308, which is also labeled "threshold." The value of the frame energy metric, in so far as it concerns choosing between a half rate frame and a full rate frame—that is, choosing between frame rate hypotheses of half and full—is now decided by comparing the value of the normalized frame energy under consideration to the value of the threshold energy. If the value of the normalized frame energy under consideration is less than the value of the threshold energy, the value of the metric is "half rate frame." If the value of the normalized frame energy under consideration is greater than the value of the threshold energy, the value of the metric is "full rate frame." Similarly, thresholds can be set between the average values of other frame energies for all the frame rates in the rate set and similar comparisons can be made so that the frame energy metric produces a value for each frame rate hypothesis from the rate set being used.

Returning to the example given in FIG. 3, if the value of the normalized frame energy under consideration is greater than the value of the threshold energy, the probability that the value of the normalized frame energy under consideration actually belongs to a half rate frame is equal to the amount of area under curve 314, which is shown as shaded area 324 in FIG. 3. Thus, the probability of making an error by determining the final frame rate as a full rate frame when the frame is actually a half rate frame is equal to area 324. If it is desired to reduce this probability of error, the threshold can be shifted to the right, which reduces shaded area 324. Similarly, the probability of making an error by determining the final frame rate as a half rate frame when the frame is actually a full rate frame is equal to area 326. Shifting the threshold to the right increases area 326 and thus increases the probability of making an error by determining the final frame rate as a half rate frame when the frame is actually a full rate frame. Therefore, the error rates can be adjusted to acceptable values by adjusting the threshold value, but there is a trade-off between error rates. A frame rate determination metric using the normalized frame energies is provided, then, by using probability density functions for the distribution of each normalized frame energy in order to balance acceptable error rates, and determining a threshold for each pair of normalized frame energies. A frame rate determination metric using frame energies is also referred to as a "frame rate energy metric."

Figure 4:
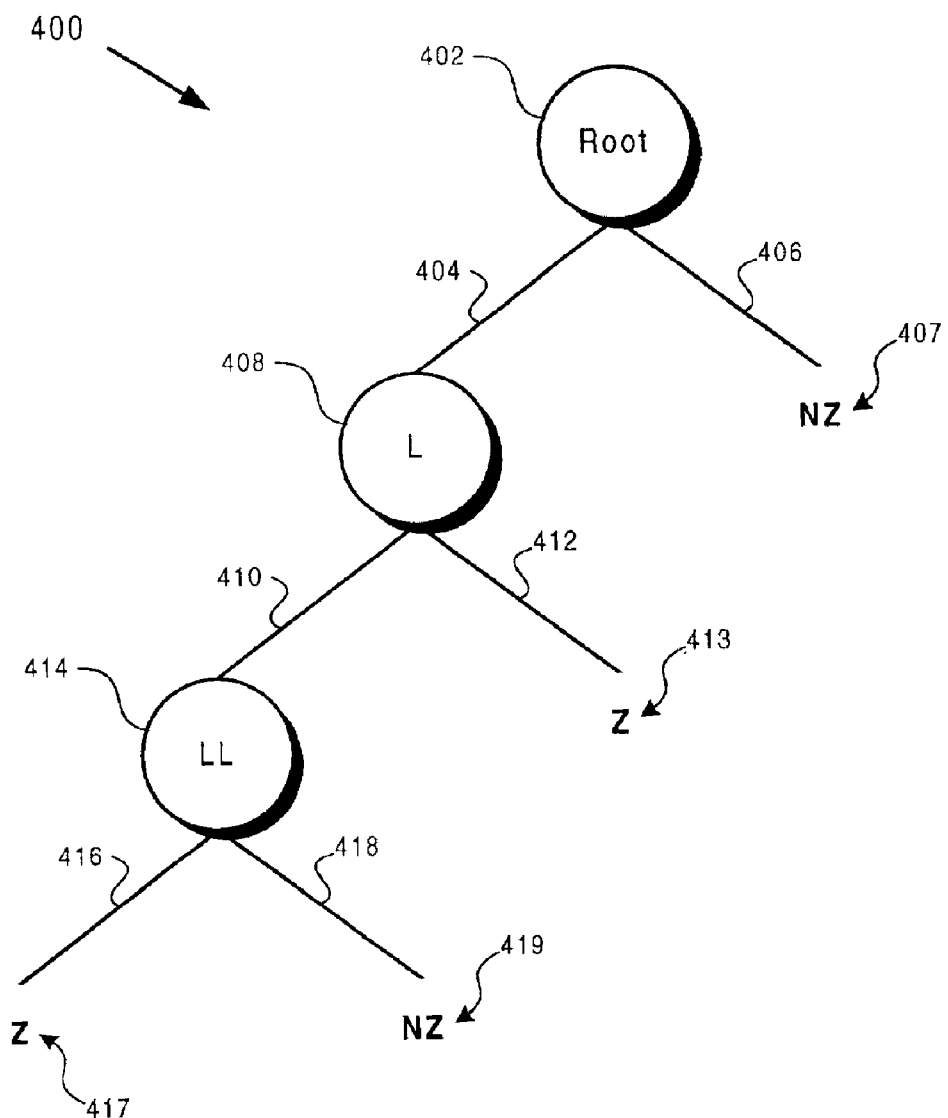
FIG. 4 illustrates an example of a decision tree for use with an algorithm for deciding frame rates in forward channel information decoding in a CDMA system.

FIG. 4 shows exemplary tree 400 for implementing a frame rate energy metric using an example frame rate energy metric algorithm according to one embodiment of the invention. Tree 400 is used to illustrate the example frame rate energy metric algorithm as described below. As shown in FIG. 4, tree 400 has root node 402, labeled "Root." Root node 402 has two "branches," left branch 404 and right branch 406. A specific equation, referred to as the root node equation, is associated with root node 402. The root node equation comprises a method, further described below, for deciding whether to follow left branch 404 or right branch 406 in order to proceed down the tree from root node 402 to continue executing the algorithm.

Tree 400 also has node 408, labeled "L." The label is unique and is assigned according to the unique path followed through tree 400 from root node 402 to node 408. In the case of node 408, the unique path consists of one left branch, i.e. left branch 404. Node 408 also has a specific equation uniquely associated with it, referred to as the L node equation. The L node equation also comprises a method for deciding whether to follow left branch 410 or right branch 412 in order to proceed down the tree from L node 408 to continue executing the algorithm.

Tree 400 also has node 414, labeled "LL." The label is unique and is assigned according to the unique path followed through tree 400 from root node 402 to node 414. In the case of node 414, the unique path consists of two left branches, i.e. left branch 404 and left branch 410. Node 414 also has a specific equation uniquely associated with it, referred to as the LL node equation. The LL node equation also comprises a method for deciding whether to follow left branch 416 or right branch 418 in order to proceed down the tree from LL node 414 to continue executing the algorithm.

Tree 400 also has "leaves." Leaf 407 is labeled "NZ," leaf 413 is labeled "Z," leaf 417 is also labeled "Z," and leaf 419 is also labeled "NZ." Each leaf represents the assignment of some value to the frame rate energy metric and termination of the example frame rate energy metric algorithm. In this example, the frame rate energy metric is assigned a value of either "Z," for a "zero-rate" frame, i.e. a frame containing no data information, or a value of "NZ," for a "non-zero rate" frame, i.e. for a full, a half, or a quarter rate frame. The non-zero rate categorization may also include an "erasure" frame. An erasure is a frame for which all the metrics return a value of zero, that is, no positive determination can be made as to the rate of the frame. By way of example, an erasure bit in the reverse channel frame can be set high and sent by the subscriber unit to the base station whenever an erasure occurs. If the rate of erasures is too high, power control at the base station can be used to increase signal power in order to lower the rate of erasures. Generally, a rate of erasures less than 1.0% is desirable. Concepts related to erasure are that of "false alarm" and "miss". A false alarm occurs if the metric assigns a value of "Z" to a non-zero rate frame or erasure and a miss occurs if the metric assigns a value of "NZ" to a zero rate frame. Generally, a rate of false alarms and misses no greater than 1 in 1,000 can be tolerated.

Returning to the root node equation, the root node equation comprises a method for deciding whether to follow left branch 404 or right branch 406 in order to proceed down the tree from root node 402 to continue executing the algorithm. The root node equation can be written in the following form ("·" is used to indicate multiplication.):

$$\alpha \cdot E_F/E_P + \beta \cdot E_H/E_P + \gamma \cdot E_Q/E_P = \delta.$$

Thus, the equation comprises a condition involving parameters $\alpha$, $\beta$, $\gamma$, and $\delta$, and normalized frame energies for full, half, and quarter rate frames (normalized by the pilot energy $E_P$, as discussed above.) The parameters $\alpha$, $\beta$, $\gamma$, and $\delta$ are determined according to the discussion above in reference to FIG. 3 regarding determination of threshold values. The specific numerical values of $\alpha$, $\beta$, $\gamma$, and $\delta$ can be determined according to a number of methods including neural nets, pattern classification, and the centroid algorithm.

The root node equation can be rewritten in the following form by multiplying the root node equation by the pilot energy, $E_P$, and subtracting the right hand side:

$$\alpha \cdot E_F + \beta \cdot E_H + \gamma \cdot E_Q - \delta \cdot E_P = 0.$$

The L node equation and LL node equation are developed in a similar fashion.

The method embodied in each node equation for deciding whether to follow the left branch from the node or the right branch from the node in order to proceed down the tree from the node to continue executing the algorithm is as follows. The specific numerical values of the frame energies under consideration are entered into the left-hand side of each equation and the result is compared to zero. Note that the normalized frame energy values are being compared because the pilot energy, $E_P$, also enters the equations. If the result is less than zero, the left branch from the node is followed. If the result is greater than zero, the right branch from the node is followed. At each new node the process of evaluating the equation associated with that node and following the left or right branch from the node is repeated. If a leaf is reached, the value of the frame energy metric indicated at that leaf is assigned to the frame rate energy metric and the algorithm terminates. In this example, the frame rate energy metric is assigned a value of either "Z," for a "zero-rate" frame, i.e. a frame containing no data information, or a value of "NZ" for either a full, half, or quarter rate frame, or possibly an erasure.

In the present example, the rates to be decided are from the second example rate set, with rates of 9600, 4800, 2400, and 0 bps (zero rate frame rather than 1200 bps), and the specific values for the node equations are as follows. Note that only the left-hand side of each equation is needed in order to specify the branch decision method for each node of the tree.

Root Node: $0.049483 \cdot E_F + 0.0233 \cdot E_H + 0.829437 \cdot E_Q - 1.471985 \cdot E_P$ L Node: $0.202521 \cdot E_F - 0.54833 \cdot E_H + 0.54773 \cdot E_Q - 0.313195 \cdot E_P$ LL Node: $1.0 \cdot E_H - 2.91637 \cdot E_P$ The execution of the example frame rate energy metric algorithm can be illustrated with a hypothetical specific numerical example as follows. Suppose that values of the frame and pilot energies have been determined as follows: $E_F=0.0$; $E_H=3.0$; $E_Q=0.0$; and $E_P=1.0$. Execution of the example frame rate energy metric algorithm begins at root node 402. The Root Node equation is evaluated by entering the frame and pilot energy values, producing $(0.0233 \cdot 3.0) - 1.471985 < 0$. The result is less than zero, so left branch 404 is followed to L node 408, and execution of the example frame rate energy metric algorithm continues at L node 408.

The L Node equation is evaluated by entering the frame and pilot energy values, producing $(-0.54833 \cdot 3.0) - 0.313195 < 0$. The result is less than zero, so left branch 410 is followed to LL node 414, and execution of the example frame rate energy metric algorithm continues at LL node 414.

The LL Node equation is evaluated by entering the frame and pilot energy values, producing $(1.0 \cdot 3.0) - 2.91637 > 0$. The result is greater than zero, so right branch 418 is followed to leaf 419, and execution of the example frame rate energy metric algorithm terminates by assigning the value "NZ" to the frame rate energy metric. In this example, the frame rate energy metric is assigned a value of "NZ" for any of the full, half, or quarter rate frames.

The frame rate energy metric can be used in conjunction with the other frame rate metrics discussed above to augment those metrics and provide improved frame rate determination, i.e. frame rate determination with a smaller frequency or rate of errors, which is therefore more reliable. One method of using frame rate energy in conjunction with the other frame rate metrics is to provide a frame rate decision algorithm. One example frame rate decision algorithm, which uses the example frame rate energy metric disclosed above in conjunction with the CRC, RSER, and Yamamoto metrics discussed above, is specified as follows.

1. Let F, H, and Q denote, respectively, full, half, and quarter frame rates.

2. For i=F, H, Q, let $CRC_i=1$ if the CRC checking produces a "match" for that frame rate as described above. Let $CRC_i=0$ otherwise.

3. For i=F, H, Q, let $Qual_i=1$ if the Yamamoto quality metric is positive for that frame rate as described above. Let $Qual_i=0$ otherwise.

4. For i=F, H, Q, let $RSER_i$=the re-encoded error symbol rate for that frame rate as described above.

5. Define IsZ=1 if the example frame rate energy metric algorithm disclosed above returned a value of "Z". Define IsZ=0 if the example frame rate energy metric algorithm disclosed above returned a value of "NZ".

6. Define a decision vector $D=(D_F, D_H, D_Q, D_Z)$ where D is binary valued with values of 0 and 1.

7. Start with $D=(0,0,0,0)$.

8. Set $D_Z=1$ if IsZ=1. Leave $D_Z=0$ if IsZ=0.

9. Set $D_F=1$ if any of the following are true:
   1. $CRC_F=1$ and $RSER_F<50$, or
   2. $CRC_F=1$ and $RSER_F<75$ and IsZ=0 or
   3. $CRC_F=1$ and $RSER_F<80$ and IsZ=0 and $Qual_F=1$.

10. Set $D_H=1$ if any of the following are true:
    1. $CRC_H=1$ and $RSER_H<60$, or
    2. $CRC_H=1$ and $RSER_H<75$ and IsZ=0, or
    3. $CRC_H=1$ and $RSER_H<93$ and IsZ=0 and $Qual_H=1$.

11. Set $D_Q=1$ if any of the following are true:
    1. $CRC_Q=1$ and $RSER_Q<56$, or
    2. $CRC_Q=1$ and $RSER_Q<80$ and IsZ=0, or
    3. $CRC_Q=1$ and $RSER_Q<105$ and IsZ=0 and $Qual_Q=1$.

12. If $D=(0,0,0,0)$, decide Erasure.

13. If $D=(D_F, D_H, D_Q, D_Z)$ has exactly one non-zero component, decide the corresponding rate, i.e. decide that a full rate frame is correct if $D_F=1$, i.e. decide F, and so forth.

14. In case of a tie, i.e. two or more non-zero components, break the tie as follows:
    1. For Z vs. F, H, or Q: decide F, H, or Q.
    2. If more than one non-zero components remain, decide the rate with the minimum $RSER_i$.
    3. For F vs. H or Q, decide H or Q.
    4. For H vs. Q, decide Q.

Thus, a frame rate decision can be made based on a combination of metrics as shown by one embodiment of the invention described here. It is manifest from the description of the above algorithm that many changes could be made to various details of the algorithm without departing from the spirit and scope of the invention. For example, a different frame rate energy metric algorithm could be used. Also, for example, changes could be made to various threshold values such as the specific re-encoded symbol error rates used above. Further, the frame rate decision algorithm could be modified by, for example, performing various steps in different orders or using different combinations of frame rate metrics.

It is appreciated by the above description that the invention provides a method and system for energy based rate determination. Although the invention is described as applied to communications in a CDMA system, it will be readily apparent to a person of ordinary skill in the art how to apply the invention in similar situations where information is to be transmitted in frames at varying rates and variable frame rate data coding is needed.

From the above description, it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, many different frame rate decision algorithms can be employed for using a frame rate energy metric in frame rate determination which may differ in detail from the algorithm presented in one embodiment of the invention described here. Also, the method of specifying an algorithm for implementing a frame rate energy metric need not rely on the tree and equation method used for specifying the algorithm presented in one embodiment of the invention described here. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method and system for energy based rate determination have been described.

What is claimed is:

1. A method comprising steps of:

supplying a sequence of code symbols to a rate decision block;

said rate decision block determining a plurality of frame energies for said sequence of code symbols, each of said plurality of frame energies corresponding to one of a plurality of tentative frame rates;

said rate decision block determining at least one final frame rate when said plurality of frame energies meet a desired condition, wherein said desired condition indicates whether a combination of said plurality of frame energies exceeds a threshold energy, wherein said combination of said plurality of frame energies comprises obtaining respective results of multiplications of each one of said plurality of frame energies by respective parameters and adding said respective results.

2. A method comprising steps of:

supplying a sequence of code symbols to a rate decision block;

said rate decision block determining a plurality of frame energies for said sequence of code symbols, each of said plurality of frame energies corresponding to one of a plurality of tentative frame rates;

said rate decision block determining at least one final frame rate when said plurality of frame energies meet a desired condition, wherein said desired condition indicates whether a combination of said plurality of frame energies and a pilot channel energy exceed a threshold energy, wherein said combination of said plurality of frame energies and said pilot channel energy comprises obtaining respective results of multiplications of each one of said plurality of frame energies and said pilot channel energy by respective parameters and adding said respective results.

3. A receiver comprising:

a decoder configured to receive and decode a sequence of code symbols;

a rate decision block coupled to an output of said decoder, said rate decision block configured to determine a plurality of frame energies for said sequence of code symbols, each of said plurality of frame energies corresponding to one of a plurality of tentative frame rates;

said rate decision block further configured to determine at least one final frame rate when said plurality of frame energies meet a desired condition, wherein said desired condition indicates whether a combination of said plurality of frame energies exceeds a threshold energy, wherein said combination of said plurality of frame energies comprises obtaining respective results of multiplications of each one of said plurality of frame energies by respective parameters and adding said respective results.

4. A receiver comprising:

a decoder configured to receive and decode a sequence of code symbols;

a rate decision block coupled to an output of said decoder, said rate decision block configured to determine a plurality of frame energies for said sequence of code symbols, each of said plurality of frame energies corresponding to one of a plurality of tentative frame rates;

said rate decision block further configured to determine at least one final frame rate when said plurality of frame energies meet a desired condition, wherein said desired condition indicates whether a combination of said plurality of frame energies exceeds a threshold energy, wherein said combination of said plurality of frame energies and said pilot channel energy comprises obtaining respective results of multiplications of each one of said plurality of frame energies and said pilot channel energy by respective parameters and adding said respective results.

* * * * *